(12) United States Patent
Takagi et al.

(10) Patent No.: US 8,621,400 B2
(45) Date of Patent: Dec. 31, 2013

(54) METHOD OF EVALUATING SYSTEMATIC DEFECT, AND APPARATUS THEREFOR

(75) Inventors: Yuji Takagi, Kamakura (JP); Yuichi Hamamura, Yokohama (JP)

(73) Assignee: Hitachi High-Technologies Corporation, Tokyo (JP)

(*) Notice: Subject to any disclaimer, the term of this patent is extended or adjusted under 35 U.S.C. 154(b) by 0 days.

(21) Appl. No.: 13/877,922

(22) PCT Filed: Sep. 30, 2011

(86) PCT No.: PCT/JP2011/072680
§ 371 (c)(1),
(2), (4) Date: Apr. 5, 2013

(87) PCT Pub. No.: WO2012/046665
PCT Pub. Date: Apr. 12, 2012

(65) Prior Publication Data
US 2013/0191807 A1    Jul. 25, 2013

(30) Foreign Application Priority Data

Oct. 6, 2010   (JP) ................................ 2010-226555

(51) Int. Cl.
*G06F 17/50* (2006.01)
*G06F 11/22* (2006.01)

(52) U.S. Cl.
USPC ............................................. 716/52; 716/136

(58) Field of Classification Search
USPC ................................................... 716/52, 136
See application file for complete search history.

(56) References Cited

U.S. PATENT DOCUMENTS

| | | | |
|---|---|---|---|
| 6,976,240 B2* | 12/2005 | Chang | 716/52 |
| 8,111,902 B2* | 2/2012 | Hiroi et al. | 382/149 |
| 2012/0151428 A1* | 6/2012 | Tanaka et al. | 716/112 |

FOREIGN PATENT DOCUMENTS

| | | |
|---|---|---|
| JP | 2001-274209 | 10/2001 |
| JP | 2006-210931 | 8/2006 |
| JP | 2009-10286 | 1/2009 |

* cited by examiner

*Primary Examiner* — Suresh Memula
(74) *Attorney, Agent, or Firm* — Antonelli, Terry, Stout & Kraus, LLP.

(57) ABSTRACT

In order to enable an evaluation of systematic defects, a method of evaluating systematic defects was configured so as to sample a circuit pattern of a specific layer of a semiconductor device, evaluate the state of superimposition between the sampled circuit pattern and circuit patterns of layers other than the specific layer, using design data, classify the state of superimposition, calculate the ratio thereof as a reference ratio, evaluate the state of superimposition between a pattern in design data corresponding to a defect of the specific layer detected by another inspection apparatus and patterns at positions corresponding to the defects in layers other than the specific layer, classify the evaluated state of superimposition, calculate the ratio of the classification as inspection-result ratio, compare the calculated reference ratio and the calculated inspection-result ratio, and evaluate systematic defects by the comparison between the calculated reference ratio and the calculated inspection-result ratio.

12 Claims, 9 Drawing Sheets

OVER

ON

OUT

| RATIO ESTIMATION DIFFERENCE | | 5% | 4% | 3% | 2% | 1% | 0.50% |
|---|---|---|---|---|---|---|---|
| RELIABILITY | 95% | 384 | 600 | 1067 | 2401 | 9604 | 38416 |
| | 96% | 420 | 657 | 1167 | 2627 | 10506 | 42025 |
| | 97% | 445 | 695 | 1236 | 2780 | 11121 | 44485 |
| | 98% | 476 | 743 | 1321 | 2973 | 11890 | 47560 |
| | 99% | 529 | 826 | 1469 | 3306 | 13223 | 52890 |
| | 99.50% | 576 | 900 | 1600 | 3600 | 14401 | 57605 |

| | | | ANALYSIS LAYER 1 | ANALYSIS LAYER 2 | ... | ANALYSIS LAYER M | COMBINATION CODE |
|---|---|---|---|---|---|---|---|
| #1 | COORDINATE (1) | C/H COORDINATE (1) | ON | OVER | | ... | A |
| #2 | COORDINATE (2) | C/H COORDINATE (2) | OUT | ON | | ... | B |
| ⋮ | ⋮ | ⋮ | ⋮ | ⋮ | | ... | ⋮ |
| #N | COORDINATE (N) | C/H COORDINATE (N) | ON | ON | | | C |

FIG. 14
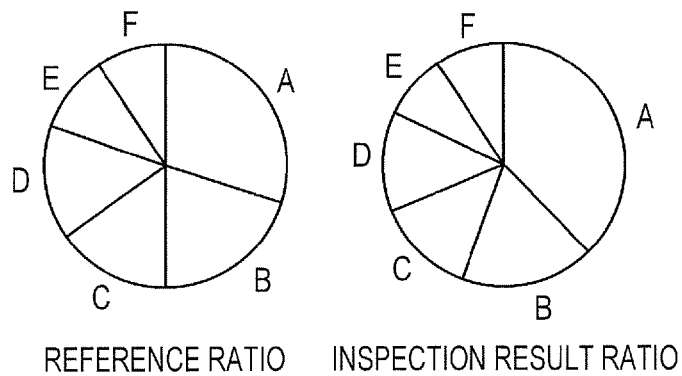
REFERENCE RATIO    INSPECTION RESULT RATIO
FIG. 15
| # | CONTACT HOLE FORMATION REGION | STATISTICAL TESTING AMOUNT/P VALUE | RISK RATE 5% | RISK RATE 1% |
|---|---|---|---|---|
| 1 | A | Z1/p1 | ● | |
| 2 | B | Z2/p2 | | |
| 3 | C | Z3/p3 | ● | ● |
| ... | ... | ... | ... | ... |
FIG. 16
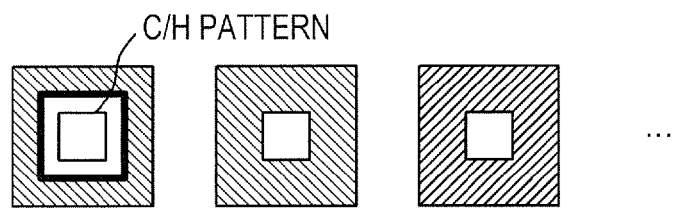

METHOD OF EVALUATING SYSTEMATIC DEFECT, AND APPARATUS THEREFOR

BACKGROUND

The present invention relates to a method and an apparatus for judging whether or not a systematic defect is occurring in a preceding process of semiconductor device manufacture, and more specifically to a method and an apparatus for judging a systematic defect which method and apparatus are preferable for, especially in a state in which a plurality of layers are superposed on each other, identifying the layer contributing to the occurrence of the systematic defect attributable to circuit design and a circuit pattern within the layer.

Following advance in miniaturization of a circuit pattern of a semiconductor device, a method for manufacturing it has become increasingly sophisticated. Accordingly, there also arise changes in occurring defects. That is, while randomly occurring defects caused by, for example, dust or a foreign substance haven been conventionally dominant, following the miniaturization of the circuit pattern, highly design-dependent defects correlated with wire or element arrangements and defects caused by, for example, a shape of a specific layer or superposition of layers have increased.

These defects highly dependent on the circuit design are called systematic defects. They include: for example, resistance abnormality due to pattern shape variation attributable to a foundation step difference; and contact hole conduction failure due to unsatisfactory etching of a gate oxide film in a specific region.

The occurrence of the systematic defect can be prevented by changing design data of the shape or partially changing manufacturing condition in many cases. Thus, there have been increasing demands for a function of judging, from a defect detected by an inspection device, whether or not there is a defect (systematic defect) attributable to the circuit design.

SUMMARY

Of the systematic defects, the defect caused by a degree of superposition of a surface layer and a lower layer cannot be judged based on abnormality at the surface layer detectable through an appearance inspection and attempts to identify a cause of the defect have been made by performing section observation at a position of the defect. However, it raises a problem that the defect section observation takes time and it is also difficult to judge through a small number of section observations whether the defect is accidental or attributable to systematic properties.

In view of this problem, a method for determining a systematic defect by comparing defect inspection data with circuit design data (hereinafter, design data) is disclosed in Japanese Patent Application Laid-Open Publication No. 2009-10286 (Patent Document 1). In Patent Document 1, there is disclosed a method for defining, based on design data, a plurality of regions on a chip subject to an inspection in accordance with a circuit design shape, comparing defect densities of detected defects in the different regions, and determining a systematic defect based on a difference between the regions. However, in Patent Document 1, it is not defined in which range on the chip the defined plurality of regions are set, and if they are set in an extremely small region on the chip, reliability of the defect density difference between the regions used upon the determination of the systematic defect deteriorates, and if they are set on the entire chip surface, the reliability of the defect density difference used upon the determination of the systematic defect improves but there arises a problem that this is not practical since enormous calculation is required for the region definition based on the design data.

In view of the problem described above, it is an object of the present invention to provide, in a method for judging a systematic defect using design data and defect inspection data, a statistically reliable method for judging the defect.

To address the problem described above, in the invention, a method for judging a systematic defect attributable to a circuit design of a semiconductor device is realized by the steps of: sampling a circuit pattern of a specific layer of the semiconductor device, judging, by using design data, a state of superposition of the sampled circuit pattern and a circuit pattern of at least one of layers other than the specific layer, performing classification in accordance with the state of superposition, and calculating a ratio thereof as a reference ratio; judging a state of superposition of a pattern on the design data corresponding to a position of a defect detected by inspecting the specific layer by another inspection device and a pattern of the layer other than the specific layer at a position corresponding to the position of the defect, classifying the judged state of superposition in accordance with the state of superposition, and calculating the classified ratio as an inspection result ratio; comparing the calculated reference ratio with the calculated inspection result ratio; and judging the systematic defect attributable to the circuit design of the semiconductor device based on results of the comparison between the reference ratio and the inspection result ratio.

Moreover, to address the problem described above, in the invention, an apparatus for judging a systematic defect attributable to a circuit design of a semiconductor device is provided with: an input means adapted to input circuit design data of the semiconductor device; sampling means adapted to sample a circuit pattern of a specific layer from the circuit design data of the semiconductor device inputted by the input means; first superposition judgment means adapted to judge a state of superposition of the circuit pattern of the specific layer of the semiconductor device sampled by the sampling means and a circuit pattern of at least one layer other than the specific layer; reference ratio calculation means adapted to classify the state of superposition judged by the first superposition judgment means in accordance with the state of superposition, and calculating the classified ratio as a reference ratio; circuit pattern identification means adapted to identify a circuit pattern on the circuit design data corresponding to a position of a defect detected by inspecting the specific layer with another inspection device; second superposition judgment means adapted to judge a state of superposition of the circuit pattern identified by the circuit pattern identification means and the circuit pattern of the layer other than the specific layer; inspection result ratio calculation means adapted to classify the state of superposition judged by the second superposition judgment means and calculate a classified ratio as an inspection result ratio; comparison means adapted to compare the reference ratio calculated by the reference ratio calculation means with the inspection result ratio calculated by the inspection result ratio calculation means; and systematic defect judgment means adapted to judge the systematic defect attributable to the circuit design of the semiconductor device based on results of the comparison between the reference ratio and the inspection result ratio by the comparison means.

According to the aspects of the invention, from defects detected by an appearance inspection device in a preceding process of semiconductor device manufacture, a systematic defect can be determined with high reliability, thus making it possible to quickly perform measures such as design change of problematic design and partial change of manufacturing condition.

These features and advantages of the invention will be apparent from the following more particular description of preferred embodiments of the invention, as illustrated in the accompanying drawings.

BRIEF DESCRIPTION OF THE DRAWINGS

FIG. 14 is a diagram of the reference ratio and the inspection result ratio expressed in circle graphs.

FIG. 15 is a diagram showing statistical testing amounts and corresponding p values, and results of judgment using the statistical testing amounts.

FIG. 16 is a diagram showing one example of display of states of superposition of the C/H pattern and lower layer patterns.

DESCRIPTION OF THE PREFERRED EMBODIMENTS

Hereinafter, the embodiment of the present invention will be described with reference to the drawings.

Embodiment

As a process in which a systematic defect of a semiconductor device occurs, which is a target of the invention, the embodiment will be described, referring to an example of a C/H process of forming a contact hole (hereinafter, C/H).

Figure 1:
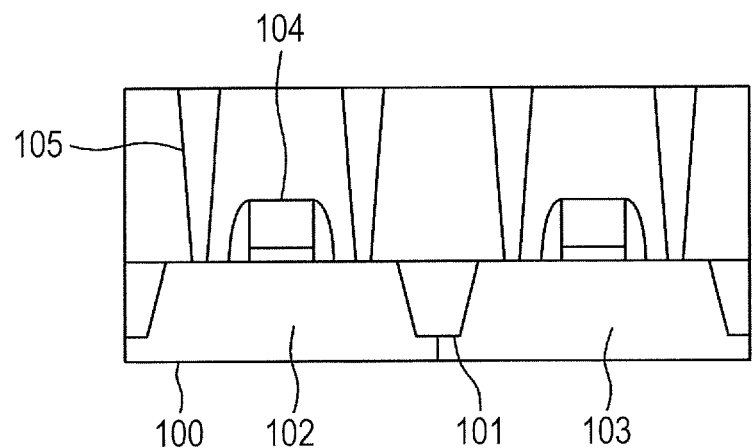
FIG. 1 is a sectional diagram of a semiconductor device formed through a C/H process.

FIG. 1 is a sectional diagram of the C/H process. Ions are doped on a base material 100 and on both side isolated by an STI 101, an n well 102 or a p well 103 is formed, and a gate electrode 104 is arranged thereon to form a transistor, on both sides of which a C/H 105 is grounded.

Figure 2:
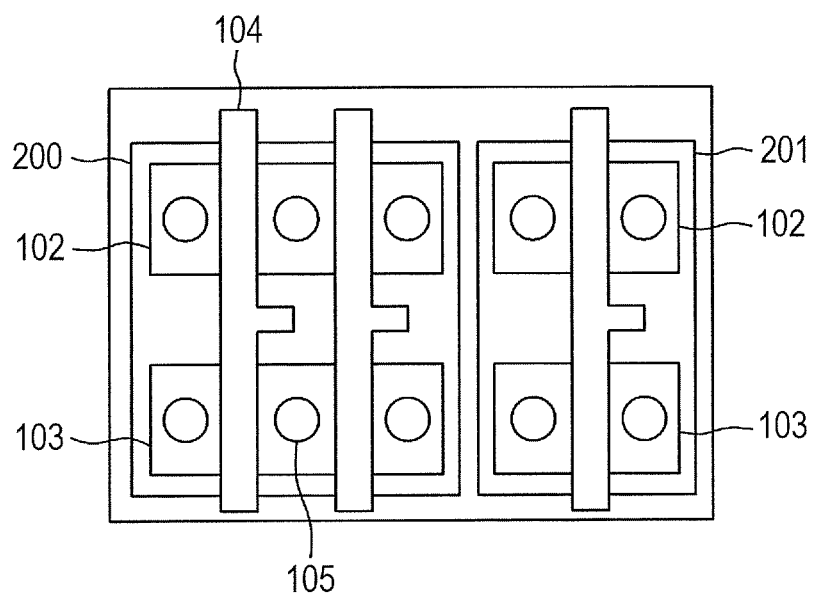
FIG. 2 is a plan diagram of the semiconductor device formed through the C/H process.

FIG. 2 is a diagram of the C/H process viewed from top, displaying each layer in a wire frame. The C/H 105 is discriminated not only by the n well 102 and the p well 103 but also by whether or not it belongs to a normal MOS breakdown voltage region 200 or a high-voltage MOS breakdown voltage region 201. The regions indicated by 102 and 103 or 200 and 201 are processed by different processing processes, and thus if there is a problem with the processing processes or if there arises a problem due to interaction between the processing processes and circuit pattern shapes of the regions, there may arise a problem in C/H grounding in any combination.

In this embodiment, it is made possible to quickly and quantitatively determine a systematic defect caused by a combination of circuit pattern shapes of one or more layers by use of appearance inspection data.

Figure 3:
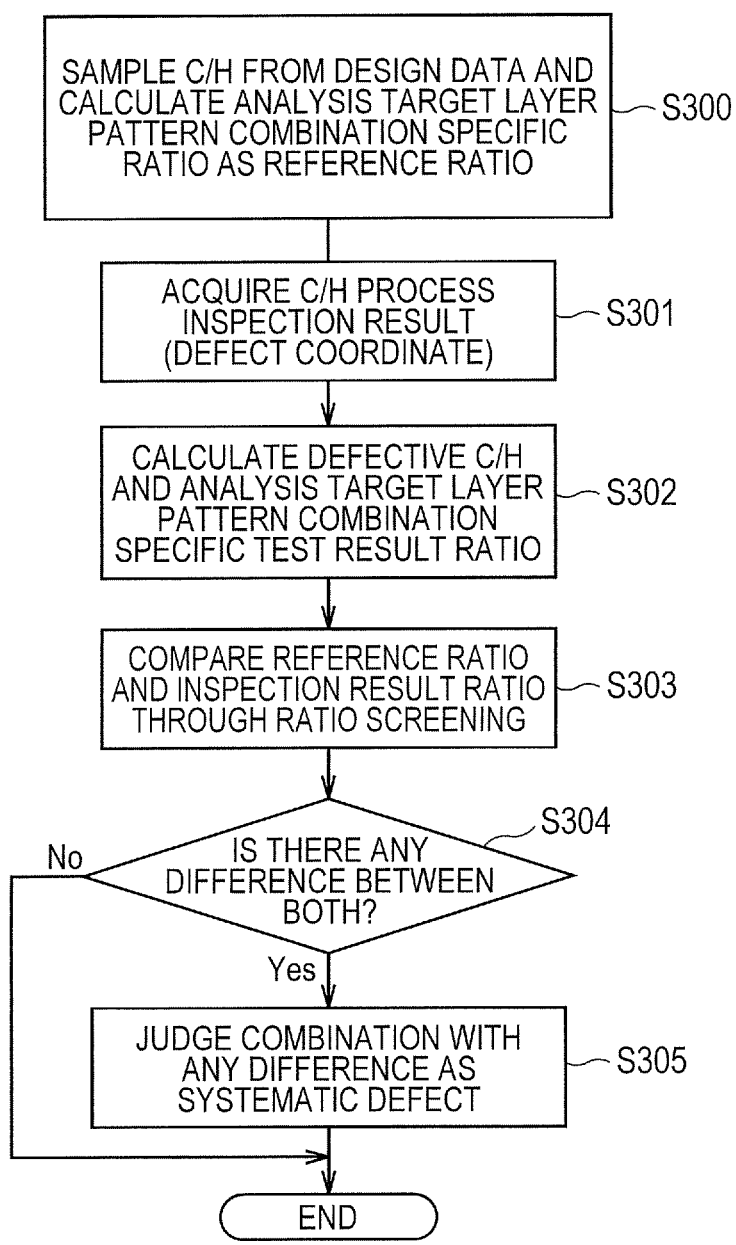
FIG. 3 is an overall flow diagram according to an embodiment of the invention.

FIG. 3 shows a rough flow. First, a C/H pattern is sampled from design data of a C/H layer as an inspection target layer, then, based on combinations of circuit design patterns of one or more layers as analysis target layers other than the inspection target layer corresponding to positions of the sampled C/H patterns, the C/H pattern is classified, and a proportion of each combination is calculated as a combination specific reference ratio (S300).

Next, information of a defective C/H coordinate as a coordinate of a defect extracted as a result of inspecting after the C/H process, by use of an optical inspection device or an inspection device using SEM, appearance of the C/H pattern formed in the C/H process is acquired (S301), based on the combinations of the circuit design patterns of the one or more layers as the analysis target layers other than the inspection target layer corresponding to a position of the defective C/H, the defective C/H is classified, and a ratio of each combination is calculated as an inspection result ratio (S302). Finally, the reference ratio and the inspection result ratio are compared to each other (S303), it is checked if there is a significant difference in any specific combination (S304), and if there is any combination having a significant difference, this combination is judged as a systematic defect (S305).

Figure 4:
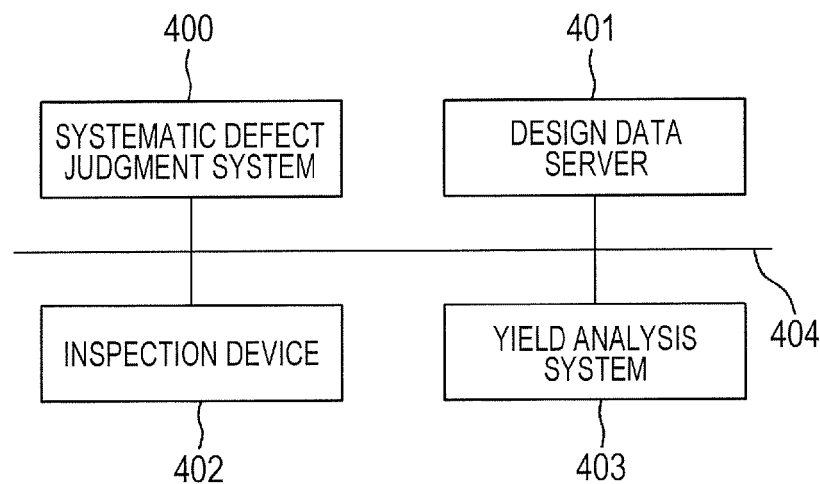
FIG. 4 is a block diagram including an apparatus and a system related to a systematic defect judgment system.
Figure 7:
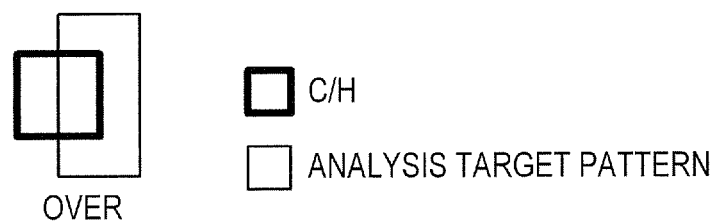
FIG. 7 is a plan diagram of a C/H pattern a state of superposition of the C/H pattern and an analysis target pattern.
Figure 8:
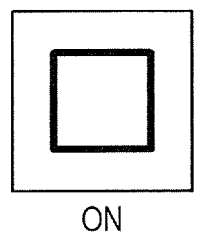
FIG. 8 is a plan diagram of the C/H pattern illustrating a state of superposition of the C/H pattern and the analysis target pattern.
Figure 9:
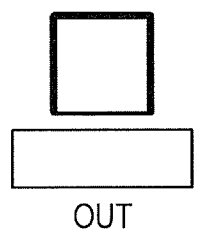
FIG. 9 is a plan diagram of the C/H pattern illustrating a state of the C/H pattern and the analysis target pattern.
Figures 10, 11, 12:
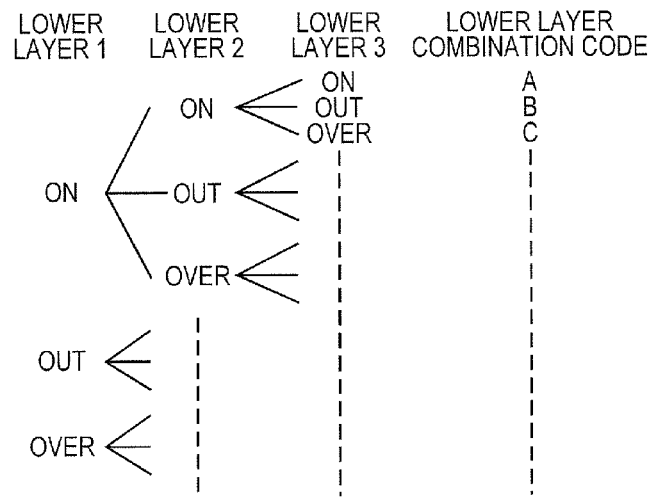
FIG. 10 is a table showing the number of times of sampling corresponding to reliability and ratio estimation differences.
FIG. 11 is a summary table for reference ratio calculation.
FIG. 12 is an example of generating combination codes of analysis target layers.

Hereinafter, the reference ratio calculation will be described with reference to FIGS. 4 to 12. FIG. 4 is an overall diagram including a device and a system related to a systematic defect judgment system as the aforementioned system, FIG. 5 is a configuration diagram of this system, FIG. 6 is a detailed processing flow of the reference ratio calculation, FIGS. 7, 8, and 9 are diagrams illustrating a state of superposition of the C/H pattern and the analysis target pattern, FIG. 10 is a table showing the numbers of times of sampling with respect to reliability and ratio estimation differences, FIG. 11 is a summary table for the reference ratio calculation, and FIG. 12 is an example of generating combination codes of the analysis target layers.

FIG. 4 is the overall diagram of the device and the system related to the systematic defect judgment system as the aforementioned system. A systematic defect judgment system 400, a design data server 401 that manages design data, an optical type or a SEM type wafer appearance inspection device 402, and a yield analysis system 403 that manages appearance inspection data, etc. and supports yield analysis are connected to a core LAN 404.

Figure 5:
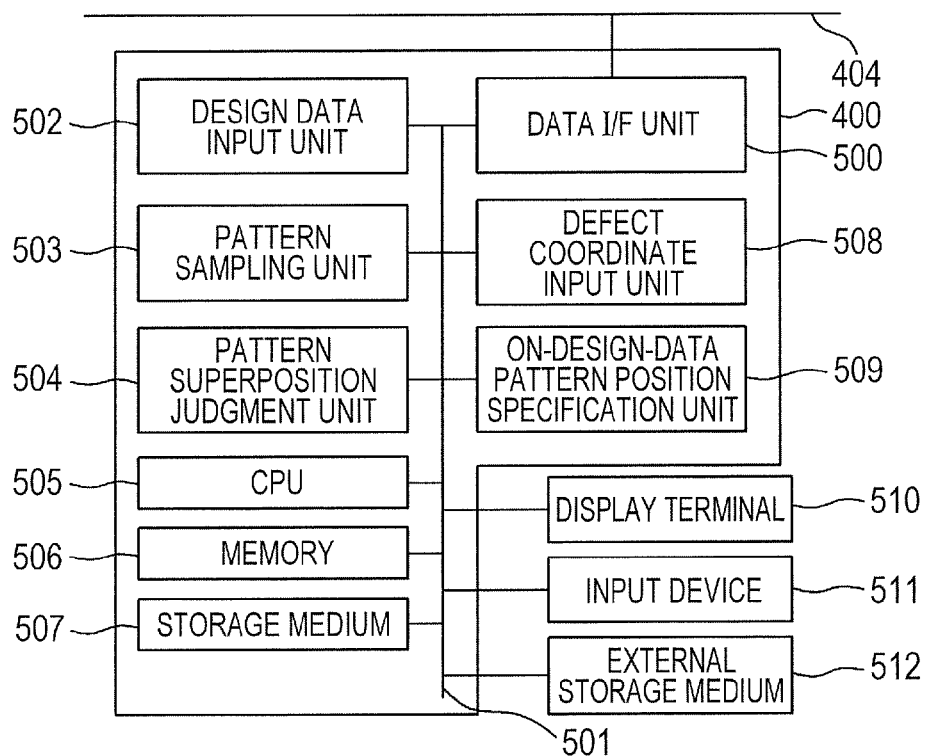
FIG. 5 is a block diagram showing detailed configuration of the systematic defect judgment system.

FIG. 5 is the diagram showing detaned configuration of the systematic defect judgment system 400. Data delivery and acceptance to and from the core LAN 404 at a factory is performed by a data I/F unit 500, and internal data transfer is performed by a bus 501. Connected to the bus 501 are: a design data input unit 502, a circuit pattern sampling unit 503, a pattern superposition judgment unit 504, a CPU 505, a memory 506, a storage medium 507 such as a hard disc or a nonvolatile memory, a defect coordinate input unit 508, and an on-design-data pattern position identification unit 509, and connected to the outside are: a display terminal 510 and an input device 511, such as a keyboard, intended for numerical data inputting and data specification. Moreover, to the outside, an external storage medium 512 such as a hard disc, a non-volatile memory, or a CD-ROM may be connected.

Figure 6:
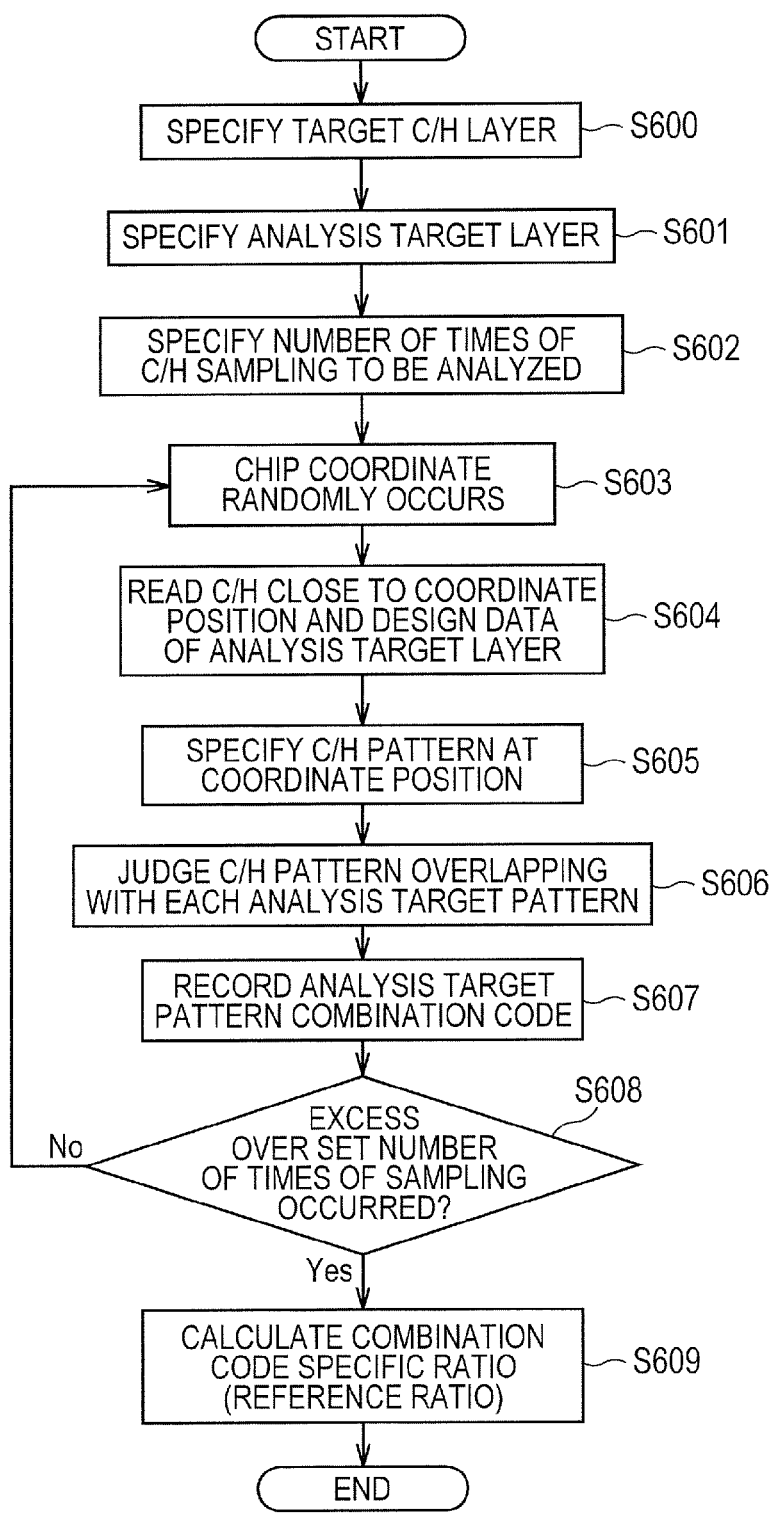
FIG. 6 is a flow diagram showing a detailed processing flow of reference ratio calculation in S300.

FIG. 6 is the detailed flow for the reference ratio calculation in step S300 shown in FIG. 3. First, the targeted C/H layer is specified (S600), and the analysis target layer lower than the C/H layer is specified (S601). These specifications are performed through the input device 501 of FIG. 5, inputted data is stored into the memory 506, and design data corresponding to the inputted layer is read through the design data input unit 502 and stored into the memory 506.

Subsequently, the number of times of sampling of the CH to be analyzed is specified (S602). The number of times of sampling is determined in accordance with the following concept in view of reliability and difference of the calculated reference ratio.

An average in sample average p=x/n (n is the number of times of sampling) is a real average P and variance is S=sqrt (P*(1−P/n)) (sqrt (X) denotes a route square of X). Based on the fact that a range in which p is distributed with reliability α=95% is [P−1.96*S, P+1.96*S] based on a standard deviation distribution table, a difference e (estimated difference of a population rate) is e=1.96*S=1.96*sqrt(P*(1−P)/n), and the number (n) of times of sampling is calculated as $$n=[P*(1-P)*1.96^2]/e^2 \quad \text{(Formula 1)}$$

where X^2 denotes a square of X.

Avoiding underestimation of the number of times of sampling, Formula 1 provides a maximum value where P=0.5, and thus at a reliability of 95%, relationship between n and e at this point is:

$$n=0.5^2*1.96^2/e^2.$$

Similarly, obtained as the relationship between n and e at reliabilities of 96%, 97%, 98%, 99%, and 99.5% are in order:

$$n=0.5^2*2.05^2/e^2$$

$$n=0.5^2*2.17^2/e^2$$

$$n=0.5^2*2.32^2/e^2$$

$$n=0.5^2*2.58^2/e^2$$

$$n=0.5^2*2.81^2/e^2$$

FIG. 10 shows a table summarizing results of calculating the number of times of sampling with the reliability and the estimation differences as variables. Further, when necessary, a range of the ratio estimation difference and the reliability are enlarged and the calculated numbers of times of sampling are put into a table. This table is shown on the display terminal 510. The calculated numbers of times of sampling are inputted by the input device 511 or the table is stored into the memory 506, and conversion into the numbers of times of sampling is performed inside the system based on the ratio estimation differences and the reliability inputted by the input device 511.

Subsequently, a chip coordinate is randomly generated by the circuit pattern sampling unit 503 (S603), the design data in a region within a given range with this coordinate as a center is read from the design data of the C/H layer and the analysis target layers stored in the memory 506, and is then stored into the circuit pattern sampling unit 503 (S604). Next, one C/H pattern within the region of the read C/H layer is extracted (S605). An extraction method may be a pattern closest to the coordinate or a pattern first found at time of scanning within the region. If no C/H pattern is found in S605, the processing returns to S603 without incrementing the number of times of sampling performed until then (not shown in FIG. 6). Next, in S606, it is judged the state of superposition of the C/H pattern and the analysis target pattern.

The judgment on the state of superposition of the C/H pattern and the analysis target circuit pattern is performed for each analysis target layer. The state of superposition is, as shown in FIGS. 7 to 9, judged at the pattern superposition judgment unit 504: for example, the C/H pattern indicated by a thick line and the analysis target pattern indicated by a thin line are in an OVER (FIG. 7) state, in an ON (FIG. 8) state, and in an OUT (FIG. 9) state. Note that, however, the state of superposition is not limited to them. Results of the judgment of each analysis target layer is recorded into a summary table as shown in FIG. 11, and stored into the memory 506.

Upon end of the judgment on all the analysis target layers, a combination of each layer as a judgment result is recorded as a combination code into the table (S607) and stored into the memory 506. FIG. 12 shows an example of combination codes when there are three lower layers. There are three types of judgment results for each layer, and thus 27 codes are defined. In S608, the number of times of sampling performed until then is incremented by 1, if the number of times of sampling does not exceed the specified number of times of sampling specified in the S602, the processing returns to S603, and the abovementioned action is repeatedly executed.

When the number of times of sampling has exceeded the number of times of sampling set in S602, a combination code specific ratio for the number of times of sampling set in S602 is calculated in step S609, and this is stored as a reference ratio into one or more of the memory 506, the storage medium 507, or the storage medium 512. Moreover, for the subsequent inspection result ratio calculation, information and combination codes of the analysis target layers corresponding to the C/H layer are stored into one or more of the memory 506, the storage medium 507, or the storage medium 512.

Figure 13:
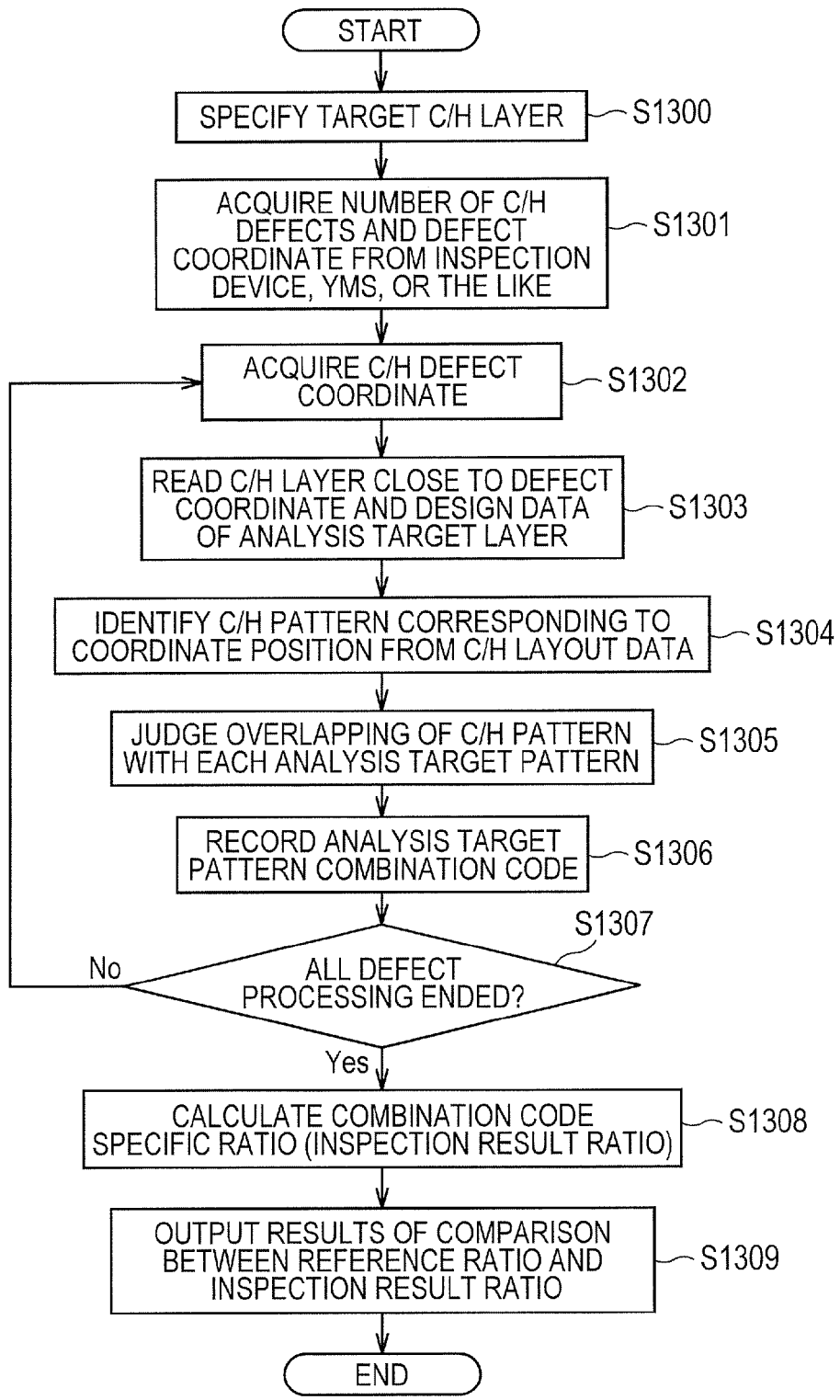
FIG. 13 is a flow diagram showing a detailed processing flow of inspection result ratio calculation in S302.

Subsequently, referring to FIG. 13, the inspection result ratio calculation in step S302 of FIG. 3 will be described. First, the target C/H layers are specified (S1300). These specifications are performed through the input device 511 of FIG. 5 by an operator, the inputted data is stored into the memory 506, and design data corresponding to the inputted layers is read via the design data input unit 502 and stored into the memory 506. Moreover, the information of the analysis target layers, corresponding to the C/H layers, set in S604 or S606 at time of creating the reference ratio is read out from the memory 506, the storage medium 507, or the storage medium 512, this design data is read in via the design data input unit 502 and stored into the memory 506. Moreover, the combination codes set in S607 at the time of creating the reference ratio are read out from the storage medium 507 or the storage medium 512 and stored into the memory 506.

Next, the number of C/H defects obtained as a result of inspection performed with the inspection device 402 and defect coordinates are acquired from the inspection device 402 or the yield analysis system 403 and inputted into the defect coordinate input unit 508 (S1301). In S1301, the total number of C/H defects do not have to be acquired to be targeted for analysis, and an analysis region may be set and only the C/H defects within the set analysis region may be targeted for the analysis or limitations may be put on the number of analyzed C/H defects by, for example, setting the number of analyzed defects.

Next, the coordinate of one C/H defect among the C/H defects targeted for the analysis in S1302 is acquired.

Next, the design data in a region within a given range with the acquired coordinate of the C/H defect as a center is read in from the design data of the C/H layers and the analysis target layers stored in the memory 506, and are stored into the circuit pattern sampling unit 503 (S1303). Then within the region of the read design data of the C/H layers, the C/H pattern closest to the defect coordinate is identified (S1304). Possible methods of searching the C/H pattern on the design data of the C/H layer corresponding to the defect coordinate are: in addition to the aforementioned one, for example, defining the C/H pattern closest to the defect coordinate after previously positioning the defect coordinate and the design data by use of an alignment mark; and after defining the pattern that permits easy alignment on an individual location basis and then performing positioning, defining the C/H pattern closest to the defect coordinates.

Next, it is judged on the state of superposition of each analysis target layer on the identified C/H pattern (S1305), and the combination code is set (S1306). Contents of the processing in S1305 and S1306 are the same as those of S606 and S607 described in the reference ratio calculation of FIG. 6. In S1307, the number of defects processed until then is incremented by 1, and if the number of processed defects does not exceed the number of defects set in S1301, the processing returns to S1302 and the aforementioned action is repeatedly executed. When the number of processed defects exceeds the number of defects set in S1301, a combination specific ratio for the number of defects set in S1301 is calculated in S1308, and this is stored as an inspection result ratio into the memory 506. Through the aforementioned processing, the reference ratio and the inspection result ratio are obtained.

Next, the both are compared to each other and results of this comparison are outputted (S1309). Whether or not the ratio of the given combination code in the inspection result ratios is equal to the ratio of the corresponding code of the reference ratio in the comparison between the both can be quantified by obtaining a statistical testing amount:

$$Z=(p-p0)/\mathrm{sqrt}((p0(1-p0))/n) \quad \text{(Formula 2)}$$

for null hypothesis H0:p=p0 where the ratio of the combination code in the reference ratio is interpreted as a population rate p0 and the ratio of the corresponding combination code in the inspection result ratio is defined as p (note that n is the number of defective C/Hs set in S1301), and it can be judged whether or not the combination code of the inspection result ratio is equivalent to that of the relevant combination code of the reference ratio based on whether or not a p value for the statistical testing amount Z is in a rejection range (for example, 5% or 1%).

Moreover, as another possible method, the given combination code and another combination code are selected, it is tested whether or not the reference ratio and the inspection result ratio are each equal between the two codes, and this is performed for all the combinations of combination codes. The testing here is the same as the aforementioned testing method, and n in Formula 2 is the number of defective C/Hs of the selected two codes.

The statistical testing amount described above, or the statistical testing amount and judgment information based on the statistical testing amount are outputted to the display terminal 510. The outputting is not limited to the display terminal 510, and they may be outputted to the yield analysis system 403 via the storage medium 507, the external storage medium 512, or the data I/F unit 500.

FIGS. 14, 15, and 16 show the information outputted to the display terminal 510.

FIG. 14 shows circle graphs showing the reference ratio and the inspection result ratio. Display of this data is not limited to the circle graph but this data may be displayed as numerical data in a table format.

FIG. 15 is a diagram showing statistical testing accounts and corresponding p values for different contact hole grounding regions and results of judgment using the statistical testing amounts. Risk rates applied to the statistical testing amounts for the judgment are usually 5% and 1% but other numbers may be used. In a case where there is variation between the reference ratio and the inspection result ratio as a result of comparison between the p value and the risk ratio, a mark is outputted (indicated by a • mark in FIG. 15).

FIG. 16 shows one example showing states of superposition of the C/H pattern and the lower layer pattern in each combination code. For actual display, only those corresponding to the combination codes with which there is variation between the reference ratio and the inspection result ratio or some or all including them may be displayed. The superposed pattern A shown in FIG. 16(*a*) corresponds to A shown in FIGS. 14 and 15, the superposed pattern B shown in FIG. 16(*b*) corresponds to B shown in FIGS. 14 and 15, and the superposed pattern C shown in FIG. 16(*c*) corresponds to C shown in FIGS. 14 and 15. FIG. 14 through 16 may be displayed on the same screen or on different screens.

Moreover, although not shown, a chip outline may be drawn on the display terminal 510, and position of the defect judged as a systematic defect or a corresponding position identified on the design data may be displayed in the chip on the screen. Moreover, the chip outline may be drawn on the display terminal 510, and all positions of portions having the state of superposition of the pattern of the specific layer judged as the systematic defect and the circuit pattern of one or more layers other than the specific layer may be displayed in the chip on the screen.

Figure 17:
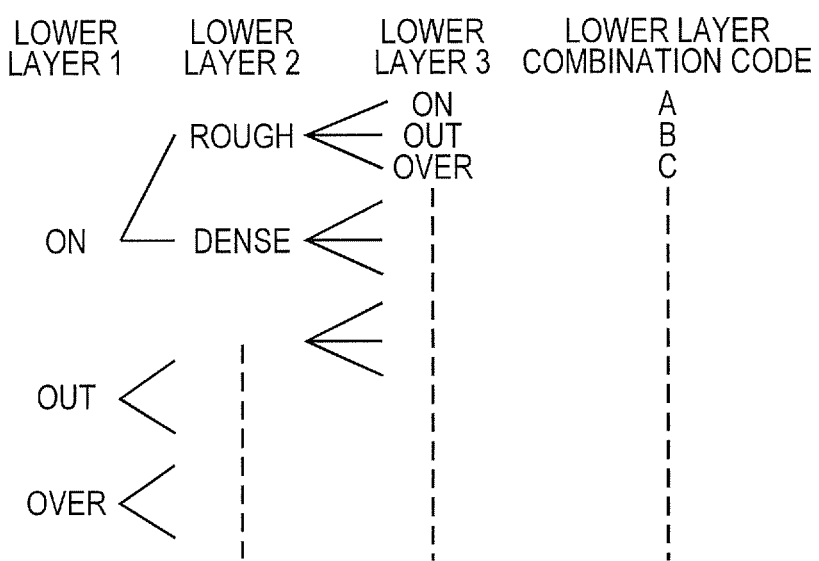
FIG. 17 is an example of generating combination codes of analysis target layers including rough and dense patterns.

The above description is provided, referring to the combinations of the C/H pattern and the circuit pattern of the lower layer below it, but the design-dependent systematic defect is not limited to the circuit pattern of the lower layer, and may be inducted by, for example, density (for example, wiring density) of the circuit pattern of the lower layer. In this case, as shown in FIG. 17, instead of the combinations of the circuit patterns, the corresponding analysis target layer may be replaced with a combination of circuit pattern densities. The combination code A in FIG. 17 shows that the C/H pattern is ON for the lower layer 1, exists in a rough region for the lower layer 2, and in an ON state for the lower layer 3. In FIG. 17, indication is provided in two levels: rough and dense, but division into several levels in numerical values may also be provided.

The method disclosed in this embodiment is not applied only to the C/H pattern in a limited manner. For example, wiring patterns (circuit patterns) are buried with their surface exposed, and if the wires are formed in rough or dense, subjecting these surfaces to CMP polishing advances shaving of the wires at their rough portions, which may create a dent called dishing. Forming a thin film thereon and further applying resist for wire formation and exposing it causes a dishing portion to detach from a surface of a focus of the exposure, and thus the resist exposure may not properly be performed and the resist may not be formed into a normal wiring pattern. Such failure can be detected by an optical inspection device.

Moreover, as a result of incorporating a test pattern for checking whether or not there is such a situation, it is also possible to capture abnormality of a measurement value by a light measurement device. It is also possible as described above that the inspection target layer is provided as a wiring layer and the analysis target layer is provided as a wiring layer below it.

The method disclosed in this embodiment is also provided as a computer-readable recording medium on which a systematic defect judgment program for letting a computer realize a function corresponding to the invention is recorded.

With the method described above, from a defect detected by the appearance inspection device in a preceding process in the semiconductor device manufacture, a systematic defect can be determined with high reliability, thus making it possible to quickly perform measures such as design change of problematic circuit design or partial change of the manufacturing condition.

INDUSTRIAL APPLICABILITY

The present invention relates to a method and an apparatus for judging whether or not a systematic defect occurs in a preceding process of semiconductor device manufacture and can be used for, especially in a state in which a plurality of layers are superposed on each other, identifying the layer causing a systematic defect occurrence of which is attributable to circuit design and also identifying a circuit pattern in the layer.

The invention may be embodied in other specific forms without departing from the spirit or essential characteristics thereof. The present embodiment is therefore to be considered in all respects as illustrative and not restrictive, the scope of the invention being indicated by the appended claims, rather than by the foregoing description, and all changes which come within the meaning and range of equivalency of the claims are therefore intended to be embraced therein.

DESCRIPTION OF THE CODES

100 . . . base plate 101 . . . STI 102 . . . n well 103 . . . p well 104 . . . gate electrode 105 . . . C/H 200 . . . normal MOS breakdown voltage region 201 . . . high-voltage MOS breakdown voltage region 400 . . . systematic defect judgment system 401 . . . design data server 402 . . . inspection device 403 . . . yield analysis system 404 . . . core LAN404 500 . . . data I/F unit 501 . . . bus 502 . . . design data input unit 503 . . . circuit pattern sampling unit 504 . . . pattern superposition judgment unit 505 . . . CPU 506 . . . memory 507 . . . storage medium 508 . . . defect coordinate input unit 509 . . . on-design-data pattern position identification unit 510 . . . display terminal 511 . . . input device 512 . . . external storage medium

The invention claimed is:

1. A method for judging a systematic defect attributable to a circuit design of a semiconductor device, the method comprising the steps of:
sampling a circuit pattern of a specific layer of the semiconductor device, judging, by using design data, a state of superposition of the sampled circuit pattern and a circuit pattern of at least one of layers other than the specific layer, performing classification in accordance with the state of superposition, and calculating a ratio thereof as a reference ratio;
judging a state of superposition of a pattern on the design data corresponding to a position of a defect detected by inspecting the specific layer by another inspection device and a pattern of the layer other than the specific layer at a position corresponding to the position of the defect, classifying the judged state of superposition in accordance with the state of superposition, and calculating the classified ratio as an inspection result ratio;
comparing the calculated reference ratio with the calculated inspection result ratio; and
judging the systematic defect attributable to the circuit design of the semiconductor device based on results of the comparison between the reference ratio and the inspection result ratio.

2. The method for judging a systematic defect according to claim 1, wherein in the step of judging the systematic defect, by using the results of the comparison between the reference ratio and the inspection result ratio, localization of defect occurrence in a case where the state of superposition is a specific state of superposition is judged.

3. The method for judging a systematic defect according to claim 1, wherein in the step of comparing the reference ratio with the inspection result ratio, ratio testing is used.

4. The method for judging a systematic defect according to claim 1, wherein the classification of the judged state of superposition in accordance with the state of superposition includes a step of, for positional relationship between the circuit pattern of the specific layer and the circuit pattern of the layer other than the specific layer, judging for each layer other than the specific layer whether the circuit pattern of the specific layer is completely included in the circuit pattern of the layer other than the specific layer, or is partially superposed on the circuit pattern of the layer other than the specific layer, or is not at all superposed on the circuit pattern of the layer other than the specific layer.

5. The method for judging a systematic defect according to claim 2, wherein, as a result of the judgment on the localization of the defect occurrence, the state of superposition of the circuit pattern of the specific layer judged as the systematic defect and the circuit pattern of the at least one layer other than the specific layer is displayed by using the design data.

6. The method for judging a systematic defect according to claim 1, wherein the circuit pattern of the specific layer is a contact hole pattern of a contact hole layer, and the layer other than the specific layer is at least one layer located below the contact hole layer.

7. An apparatus for judging a systematic defect attributable to a circuit design of a semiconductor device, the apparatus comprising:
input means adapted to input circuit design data of the semiconductor device;
sampling means adapted to sample a circuit pattern of a specific layer from the circuit design data of the semiconductor device inputted by the input means;
first superposition judgment means adapted to judge a state of superposition of the circuit pattern of the specific layer of the semiconductor device sampled by the sampling means and a circuit pattern of at least one layer other than the specific layer;
reference ratio calculation means adapted to classify the state of superposition judged by the first superposition judgment means in accordance with the state of superposition, and calculating the classified ratio as a reference ratio;
circuit pattern identification means adapted to identify a circuit pattern on the circuit design data corresponding to a position of a defect detected by inspecting the specific layer with another inspection device;
second superposition judgment means adapted to judge a state of superposition of the circuit pattern identified by the circuit pattern identification means and the circuit pattern of the layer other than the specific layer;
inspection result ratio calculation means adapted to classify the state of superposition judged by the second superposition judgment means and calculate a classified ratio as an inspection result ratio;

comparison means adapted to compare the reference ratio calculated by the reference ratio calculation means with the inspection result ratio calculated by the inspection result ratio calculation means; and systematic defect judgment means adapted to judge the systematic defect attributable to the circuit design of the semiconductor device based on results of the comparison between the reference ratio and the inspection result ratio by the comparison means.

8. The apparatus for judging a systematic defect according to claim 7, wherein the systematic defect judgment means, by using results of the comparison between the reference ratio and the inspection result ratio by the comparison means, judges the systematic defect attributable to the circuit design of the semiconductor device based on localization of defect occurrence in a case where the state of superposition is a specific state of superposition.

9. The apparatus for judging a systematic defect according to claim 7, further comprising input means adapted to input numerical values related to reliability and a difference of the reference ratio.

10. The apparatus for judging a systematic defect according to claim 7, wherein the comparison means further calculates a statistical testing amount provided by the reference ratio and the inspection result ratio, and display means adapted to display information related to the statistical testing amount calculated by the comparison means is further provided.

11. The apparatus for judging a systematic defect according to claim 7, further comprising a display means adapted to display, by the design data, all or some of kinds of states of superposition of the circuit pattern of the specific layer and the circuit pattern of the at least one layer other than the specific layer.

12. The apparatus for judging a systematic defect according to claim 7, further comprising a display means adapted to display either one or both of an on-design-data position of the defect judged as the systematic defect and a position of a portion having the state of superposition of the circuit pattern of the specific layer judged as the systematic defect and the circuit pattern of the at least one layer other than the specific layer.

* * * * *